United States Patent [19]
Behfar-Rad et al.

[11] Patent Number: 5,594,749
[45] Date of Patent: Jan. 14, 1997

[54] SEMICONDUCTOR LASER WITH LOW VERTICAL FAR-FIELD

[75] Inventors: Abbas Behfar-Rad, Wappingers Falls, N.Y.; Christoph S. Harder, Zurich; Heinz P. Meier, Thalwil, both of Switzerland

[73] Assignee: International Business Machines Corporation, Armonk, N.Y.

[21] Appl. No.: 292,900

[22] Filed: Aug. 19, 1994

Related U.S. Application Data

[62] Division of Ser. No. 136,181, Oct. 15, 1993, Pat. No. 5,376,582.
[51] Int. Cl.$^6$ ........................................... H01S 3/18
[52] U.S. Cl. ............................................ 372/45
[58] Field of Search ................................ 372/45, 46

[56] References Cited

U.S. PATENT DOCUMENTS

| | | | |
|---|---|---|---|
| 4,827,482 | 5/1989 | Towe et al. | 372/45 |
| 4,851,368 | 7/1989 | Behfar-Rad et al. | 437/129 |
| 5,059,552 | 10/1991 | Harder et al. | 437/129 |
| 5,060,235 | 10/1991 | Ikeda | 372/45 |
| 5,084,892 | 1/1992 | Hayakawa | 372/45 |
| 5,088,099 | 2/1992 | Chen et al. | 372/45 |
| 5,136,601 | 8/1992 | Kajimura et al. | 372/45 |
| 5,197,077 | 3/1993 | Harding et al. | 372/45 |
| 5,317,588 | 5/1994 | Kahen | 372/45 |

OTHER PUBLICATIONS

A. Behfar–Rad, et al., "Rectangular and L–shaped GaAs/AlGaAs lasers with very high quality etched facets" Appl. Phys. Lettr, V. 54 (6) pp. 493–495, Feb. 1989.

J. Y. Chi, et al., "Spatially selective modification of GaAs/ALGaAs quantum wells by $SiO_2$ capping and rapid thermal annealing" Appl. Phys. Lett., V. 55 (9), pp. 855–357, Aug. 1989.

M. C. Wu, et al., "A periodic index separate confinement heterostructure quantum well laser" Appl. Phys. Lett. V. 59 (9), pp. 1046–1048, Aug. 1991.

Hobson, W. S. et al., "Low–threshold GaAs/ALGaAs quantum well . . . " J. Appl. Phys. 70(1), 1 Jul. 1991, pp. 432–435.

Wagner, D. K. et al., "Operating Characteristics of Single–Quantum–Well . . . ", IEEE Jou. Quan. Elec. 24(7), Jul. 1988, pp. 1258–1265.

Williams, R. L. et al., "Extremely low threshold current . . . " Appl. Phys. Lett. 58(17), 29 Apr. 1991, pp. 1816–1818.

*Primary Examiner*—Rodney B. Bovernick
*Assistant Examiner*—Robert McNutt
*Attorney, Agent, or Firm*—H. Daniel Schnurmann

[57] ABSTRACT

A planar, topology free, semiconductor quantum-well laser is described. The quantum-well active layer is formed and patterned in a specified region which is constrained on all sides by high bandgaps which are formed through the use of impurity-free diffusion techniques. After the impurity-free diffusion has taken place, an upper portion is then epitaxially deposited to complete the structure. High-power, single fundamental mode laser operation is achieved by funneling current into the constrained quantum-well active region, high bandgap regions in conjunction with low index of refraction in regions surrounding the active area. The structure is further designed to allow low beam divergence in the direction perpendicular to the semiconductor laser junction.

17 Claims, 20 Drawing Sheets

SEMICONDUCTOR LASER WITH LOW VERTICAL FAR-FIELD

This is a Divisional patent application of U.S. patent application Ser. No. 08/136,181, filed on Oct. 15, 1993 now U.S. Pat. No. 5,376,582.

FIELD OF THE INVENTION

This invention relates generally to a semiconductor laser, and more particularly to a laser with low vertical far-field.

BACKGROUND OF THE INVENTION

Ridge lasers are routinely used to fabricate single lateral mode index guided lasers. A typical structure of this type is described in U.S. Pat. No. 5,059,552 to C. S. Harder, and of common assignee. Ridge lasers, however, have the distinct disadvantage of having large topologies (i.e., large differences in height between neighboring elements), which makes them difficult to fabricate and expensive to manufacture.

Ridge lasers have an additional disadvantage in that their topology causes a variation in the stress observed in the waveguiding region. This stress is caused by the dielectric and metallization layers—layers that are necessary to form the structure. This can result in difficulties in obtaining a well-confined single lateral mode waveguiding action.

GaAs and AlGaAs semiconductor laser structures have been used successfully to fabricate quantum wells (QWs). Recent developments have shown that a selective intermixing through the use of a $SiO_2$ cap can substantially increase the bandgap of the QW. This technique is described in the article: "Spatially selective modification of GaAs/AlGaAs quantum wells by $SiO_2$ capping and rapid thermal annealing" by J. Y. Chi, et al., published in the Appl. Phys. Lett. 55 (9), of Aug. 28, 1989, and has been successfully used to modify the bandgap profile of Qws.

Cleaving a semiconductor laser crystal has been advantageously used to form the facets of a laser. However, for mass fabrication and monolithic integration, it is desirable to use a relatively recent method, namely, forming etched facets through the use of a chemically assisted ion beam etching technique, which has been successfully used in achieving results of similar quality to that of cleaved facets. In the article: "Rectangular and L-shaped GaAs/AlGaAs lasers with very high quality etched facets", by A. Behfar-Rad, et al , published in the Appl. Phys. Lett. 54 (6), of Feb. 6, 1989, a process based on a $SiO_2$ etch mask is described, which has led to very smooth etched facets.

High power single lateral mode semiconductor lasers have found their way in a variety of applications that range from optical storage, Erbium-doped fiber amplification, and frequency doubling. Reliability considerations show that it is advantageous to have non-absorbing mirrors or facets for semiconductor lasers and especially for high-power semiconductor lasers.

Moreover, current confinement is also desirable to lower the threshold current density since it leads to a lower operating temperature for the semiconductor laser and, hence, further improves its overall reliability. Current confinement also avoids the problem of surface recombination current at the facets. Lateral current confinement within the structure has a further advantage in that it prevents current flow in regions adjacent to the waveguide, thereby making the device less susceptible to the occurrence of non-fundamental modes at high power.

Low vertical far-field (VFF) performance of the laser beam is highly desirable in many applications. A recent article entitled "A periodic index separate confinement heterostructure quantum well laser" by M. C. Wu, et al, Applied Physics Letters 59 (9), Aug. 26, 1991, shows the level of complexity that has been incorporated into the laser structure to achieve low VFF.

OBJECTS OF THE INVENTION

Accordingly, a primary object of the invention is to provide a high-power, single-mode semiconductor quantum-well laser with non-absorbing mirrors.

Another object is to avoid topology of the semiconductor laser structure to enable ease of manufacturing.

It is still another object to prevent current leakage into any unwanted regions, thereby allowing lower threshold current density and cooler laser operation.

It is a more particular object to prevent current flow near the facets of the laser by increasing the bandgap by means of an impurity-free diffusion technique that prevents surface recombination current at the facets, and which also results in non-absorbing mirrors.

It is a further object to significantly improve the reliability of the high power single mode laser operation through the use of non-absorbing mirrors.

It is yet a more particular object to provide optical confinement laterally through the use of the impurity free diffusion technique that results in a modification of the composition of the structure and, hence, the change in the index of refraction, thereby allowing single lateral fundamental mode operation.

It is still a further object to make the laser structure compatible with both conventional cleaving and etching of the facets.

It is another object to allow a variety of wavelengths through the use of a plurality of compositions and/or thicknesses for the quantum well in the semiconductor laser.

It is still another object to use GaAs, AlGaAs, InGaAs or InAlGaAs for the quantum well to provide a plurality of wavelengths for the semiconductor laser structure.

It is further another object to have a semiconductor laser structure that allows low vertical far-field.

SUMMARY OF THE INVENTION

The present invention is directed to a method of forming a quantum well laser structure in which the area that lies outside the active area of the laser is subject to the influence of a material that promotes diffusion of a supplemental element, thus limiting the active area longitudinally and laterally by increasing the bandgap outside the active area.

BRIEF DESCRIPTION OF THE DRAWINGS

The foregoing and additional objects, features and advantages of the present invention will become apparent to those skilled in the art from the following description of the invention, taken with the accompanying drawings, in which.

DETAILED DESCRIPTION OF THE DRAWINGS

Before describing an embodiment of the present invention, a brief outline of a typical ridge structure will be described in conjunction with FIG. 1.

Figure 1:
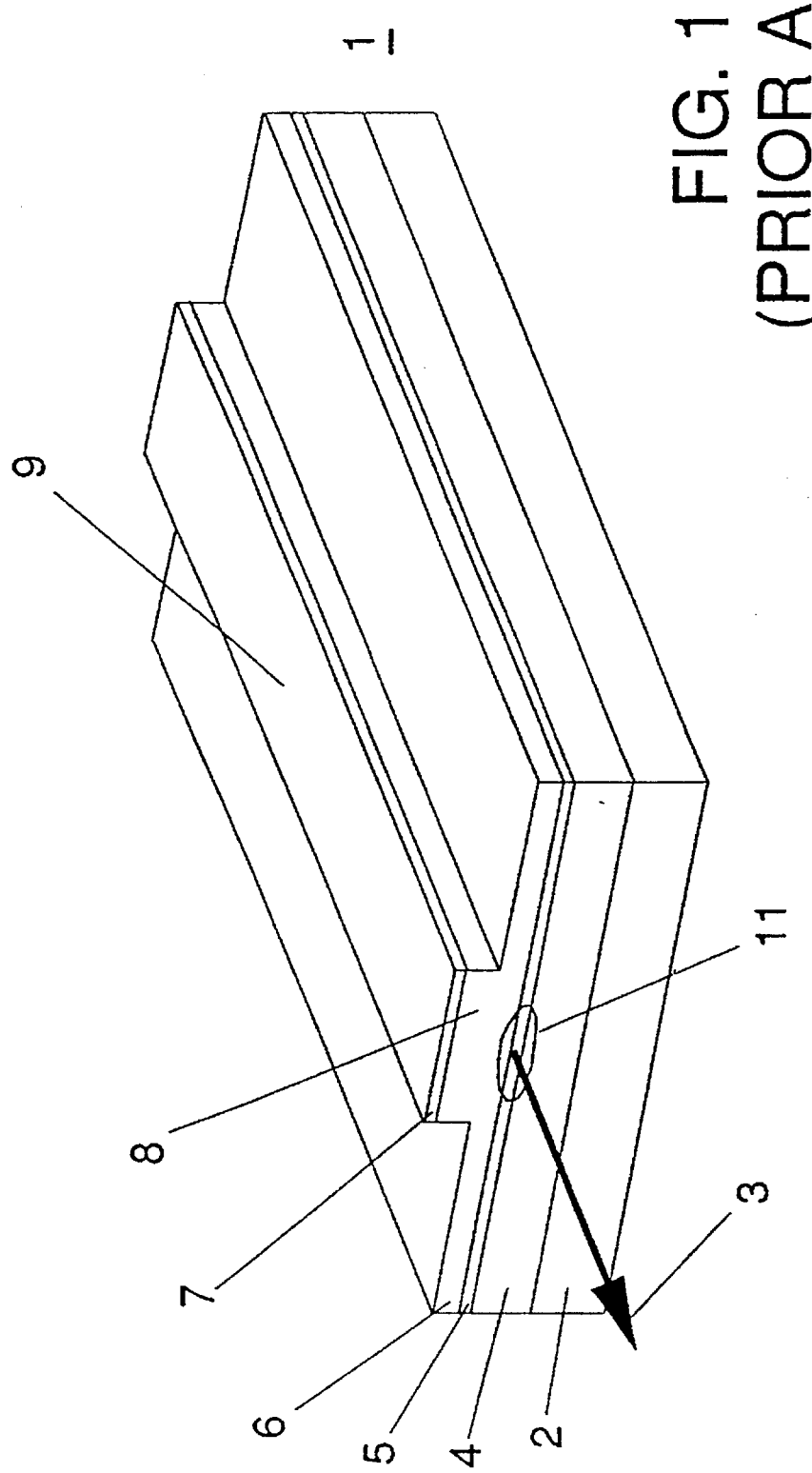
FIG. 1 is a schematic perspective view of a prior art ridge waveguide laser structure.

FIG. 1 is a perspective view of a known ridge laser structure 1 of which only major elements are shown. The layered structure, grown on a substrate 2, includes at least an active layer 5 sandwiched between cladding layers 4 and 6. The drawing shows the structure after completion of the process steps required to form the waveguide ridge 9. It comprises a contact layer 7 and a ridge section 8 of the upper cladding layer 6. Not shown in the drawing are the insulation embedding the sidewalls of the ridge and covering the surface of the upper cladding layer 6, and the metallization layers providing for electrical contacts to the completed device.

A light beam 3 is emitted when the device is activated by applying appropriate operating voltages. In the drawing, the light mode region of the laser is schematically shown as a small ellipse 11 centering around the active layer 5 and laterally defined by the ridge 9.

Figure 2:
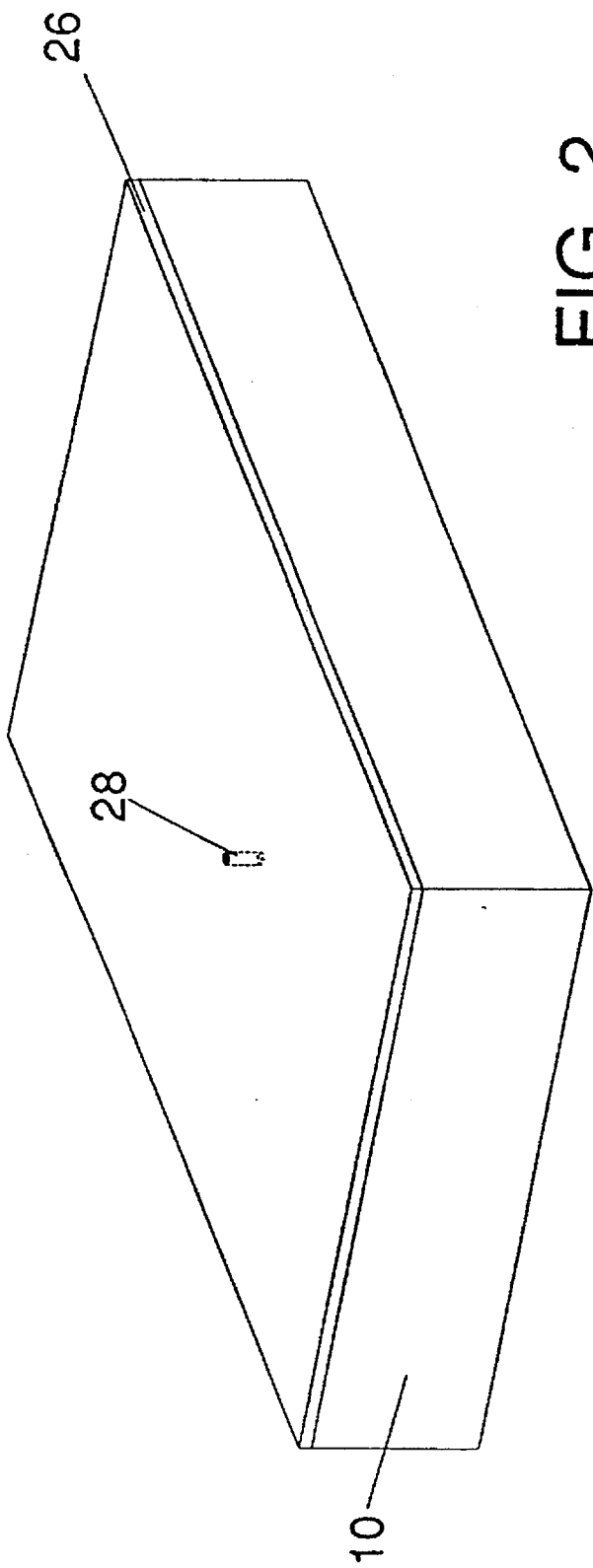
FIG. 2 is a schematic perspective view of the laser structure after an MBE (Molecular Beam Epitaxy) deposition of the lower laser structure on the substrate, in accordance with the present invention.
Figure 3:
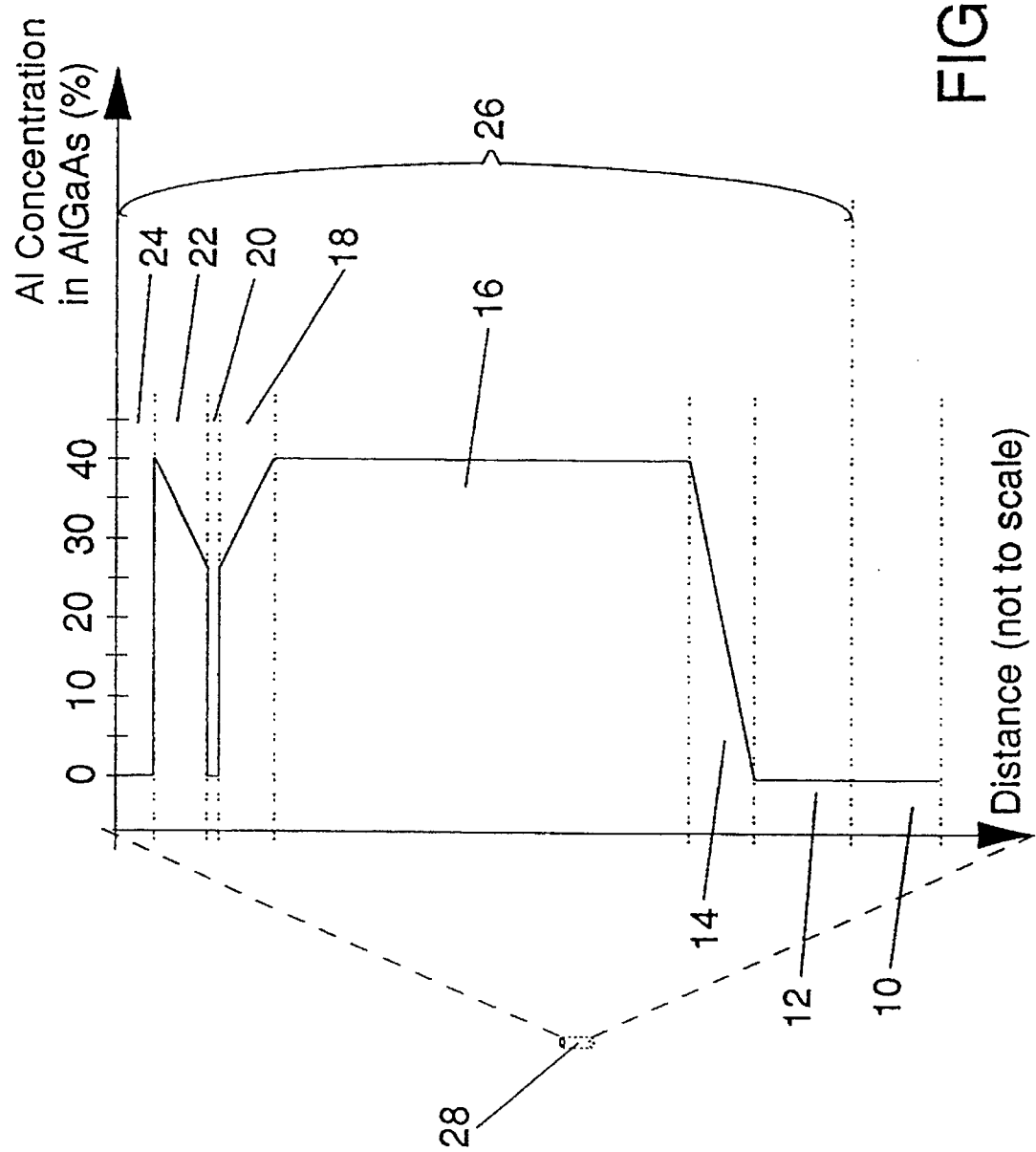
FIG. 3 shows the Al concentration in $Al_xGa_{1-x}As$ at a cross-section that starts at the surface of the structure shown in FIG. 2 and terminates in the substrate region.

Referring now to FIG. 2, an n-type GaAs substrate 10 is used in a Molecular Beam Epitaxy (MBE) system, upon which the lower portion of the laser structure 26 is epitaxially deposited. A conventional MBE system, such as the Modular GEN II System is operated in a manner well known to those skilled in the art. The laser layers are made of $Al_xGa_{1-x}As$. GaAs will be referred hereinafter as the base chemical composition, whereas Al will be referred hereinafter as a substitutional element (i.e., substituting itself in place of Ga, thereby resulting in $Al_xGa_{1-x}As$). A cross-section, taken at point 28 in FIG. 2, is shown in detail in FIG. 3. It shows various layers sequentially deposited on the substrate 10, in which preferably:

Layer 12 is an n-type GaAs buffer layer;

Layer 14 is a linearly graded layer that starts with GaAs and ends with $Al_{0.4}Ga_{0.6}As$. This layer is 100 nm thick and is n-type doped with Si;

Layer 16 is a cladding layer of $Al_{0.4}Ga_{0.6}As$, having a thickness of 2.5 um and n-type doped with Si;

Layer 18 is a linearly graded layer starting with $Al_{0.4}Ga_{0.6}As$ and ending with $Al_{0.26}Ga_{0.74}As$. Layer 18 is 100 nm thick and is undoped;

Layer 20 is an undoped GaAs quantum well (QW), 7 nm thick;

Layer 22 is an undoped linearly graded region, that starts with a composition of $Al_{0.26}Ga_{0.74}As$ and ends with $Al_{0.4}Ga_{0.6}As$. The thickness of this layer is 100 nm; and Layer 24 is an undoped GaAs cap, 200 nm thick.

Although linear grading has been described as the preferred method of grading, it will be understood that other types of gradings can be utilized to form these graded layers.

Layers 12, 14, 16, 18, 20, 22, and 24 form the lower portion 26 of the quantum well semiconductor laser structure.

Figure 4:
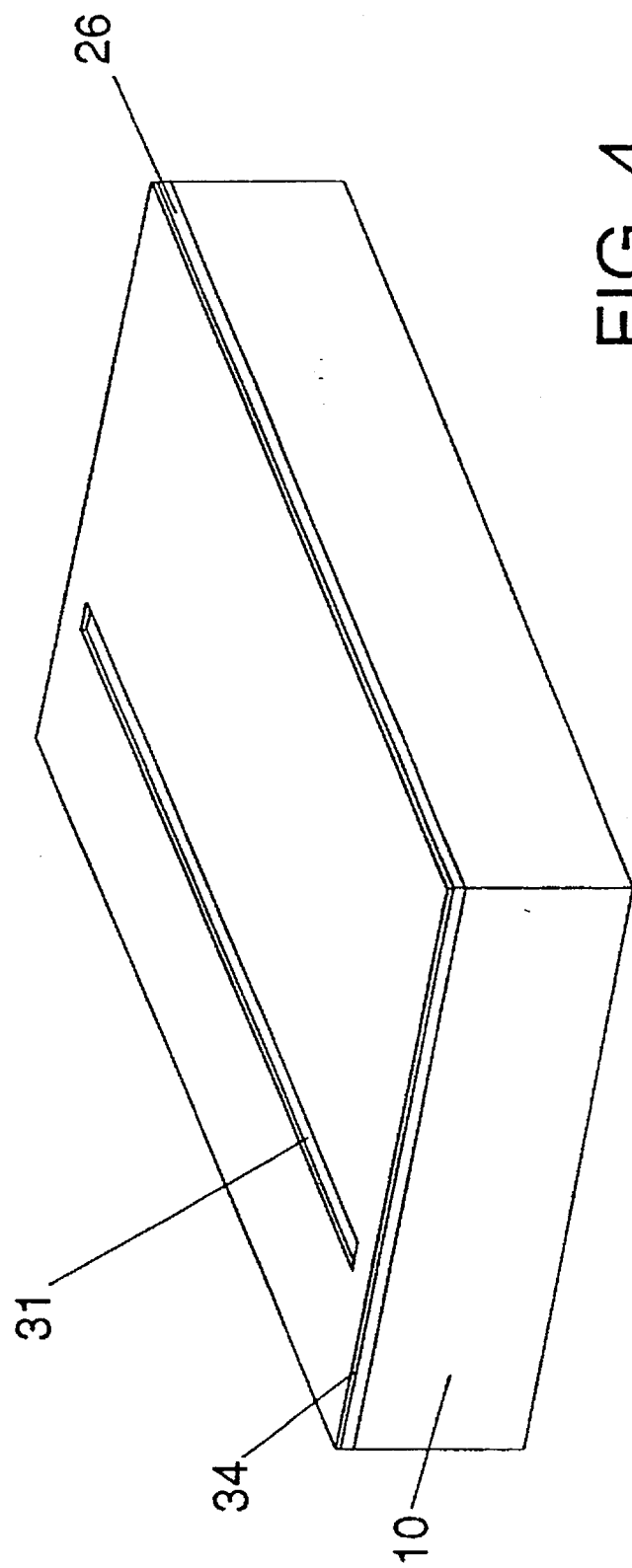
FIG. 4 shows a schematic perspective view after PECVD deposition of $SiO_2$ on the surface and opening of a hole in the $SiO_2$ layer.

Next, Plasma-Enhanced Chemical Vapor Deposition (PECVD) $SiO_2$ 34, alternatively referred to as the laser defining layer, is deposited on the surface of the lower laser structure 26. This layer is patterned using photoresist and buffered HF. Next, the photoresist is removed. A perspective view of the structure is illustrated in FIG. 4. Also shown is an opening 31 in the $SiO_2$ layer 34. Opening 31 defines the active region of the laser. The patterned $SiO_2$ is then coated with PECVD silicon nitride 36, which is in contact with layer 24 in the opening 31. The $Si_3N_4$ 36, is alternatively referred to as diffusion inhibiting layer.

Figure 5:
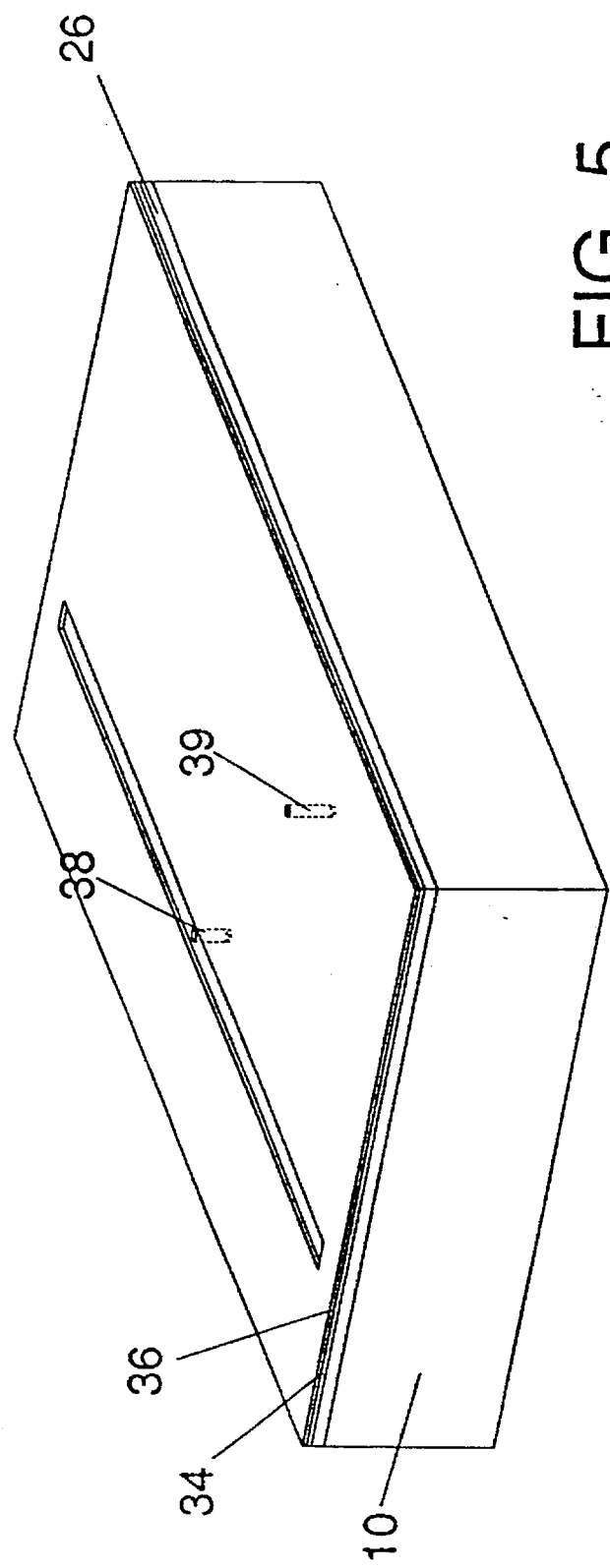
FIG. 5 is a schematic perspective view of the structure after a PECVD deposition of $Si_3N_4$.

FIG. 5 shows the structure with the $Si_3N_4$ coating 36. Two cross-sections: at location 38 (within the opening 31) and 39 (outside the opening 31) in FIG. 5 are respectively shown in FIGS. 6 and 7, and readily illustrate differences at these two points.

Figure 6:
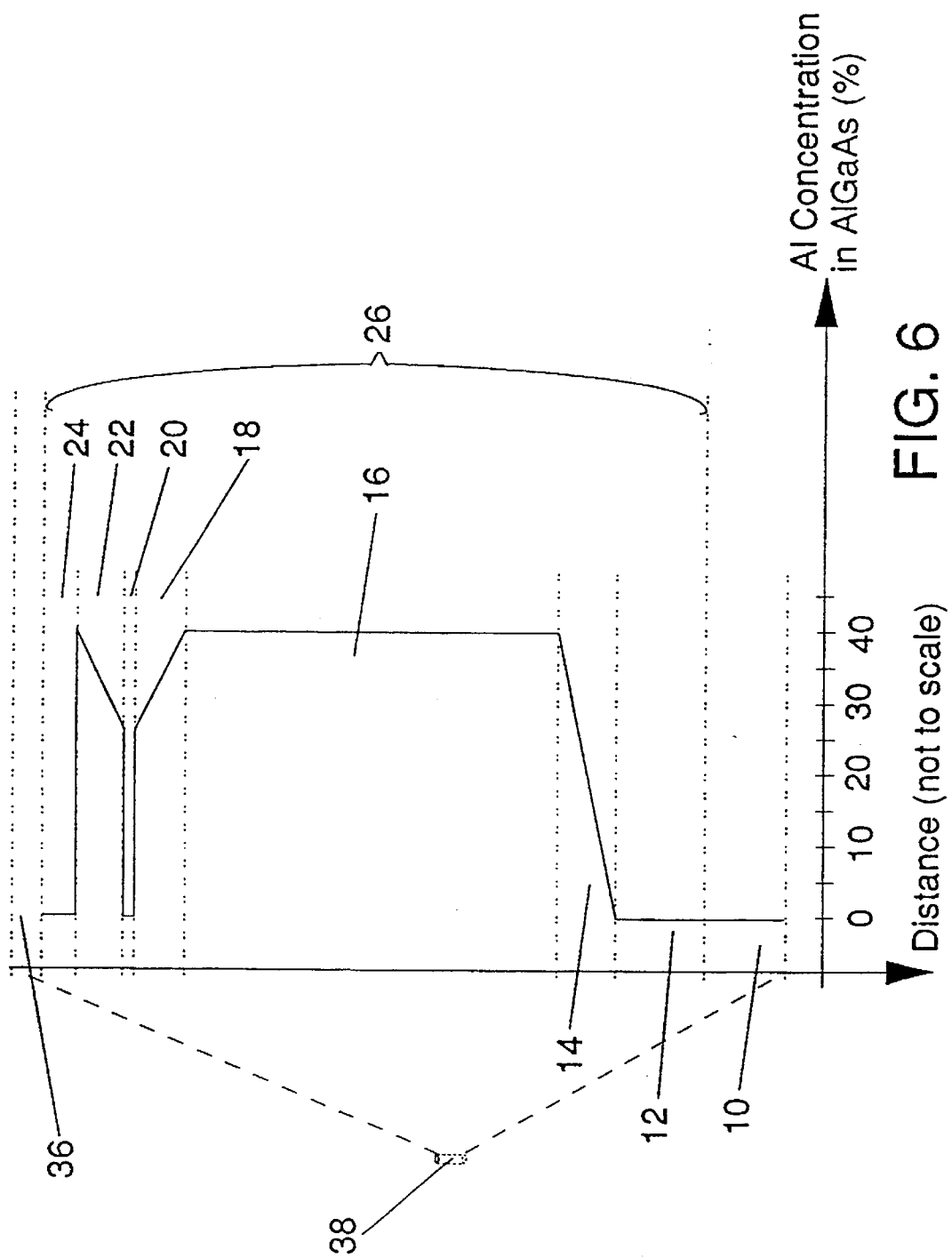
FIGS. 6 and 7 show cross-sections at two different points in the structure of FIG. 5.
Figure 7:
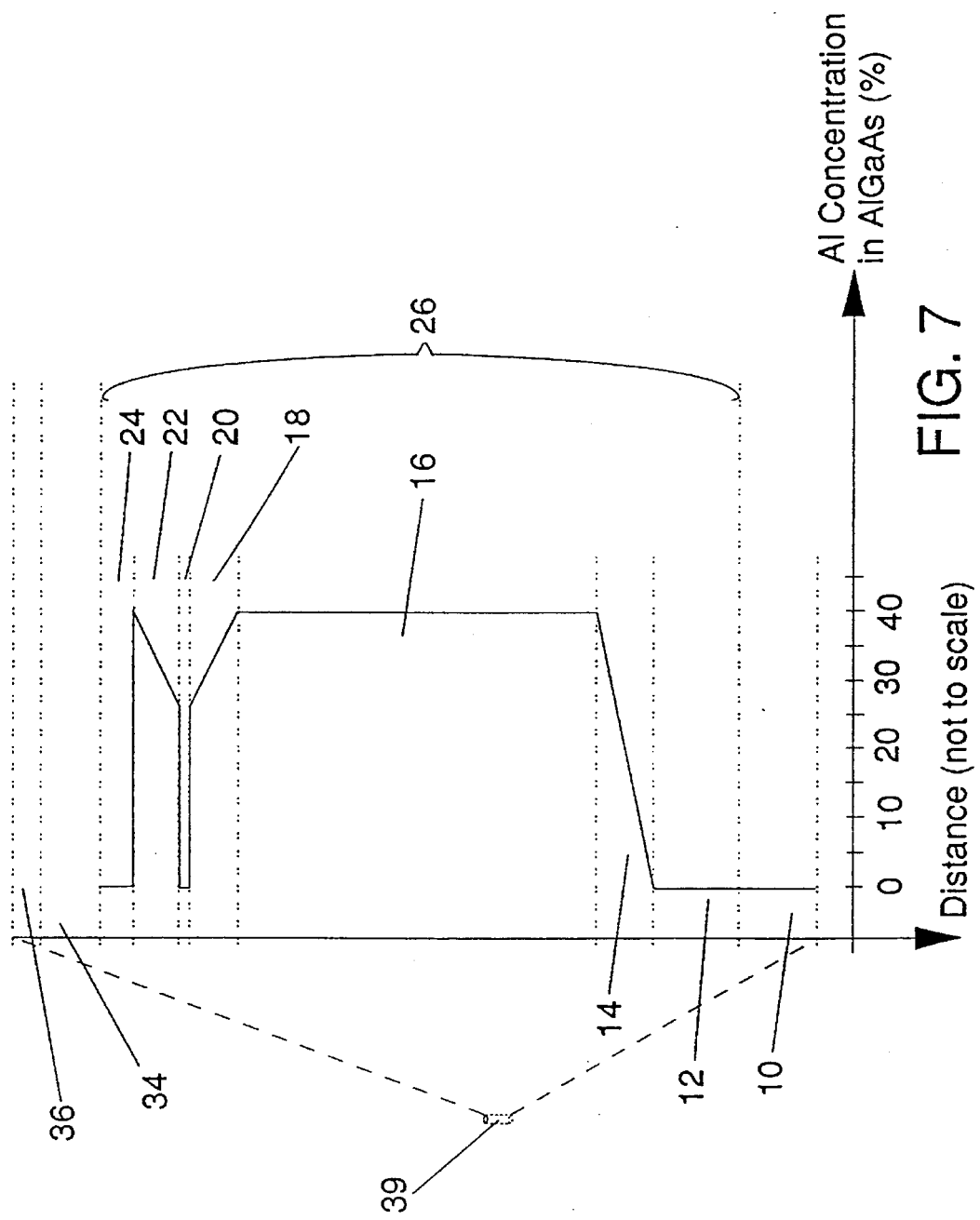
Figure 8:
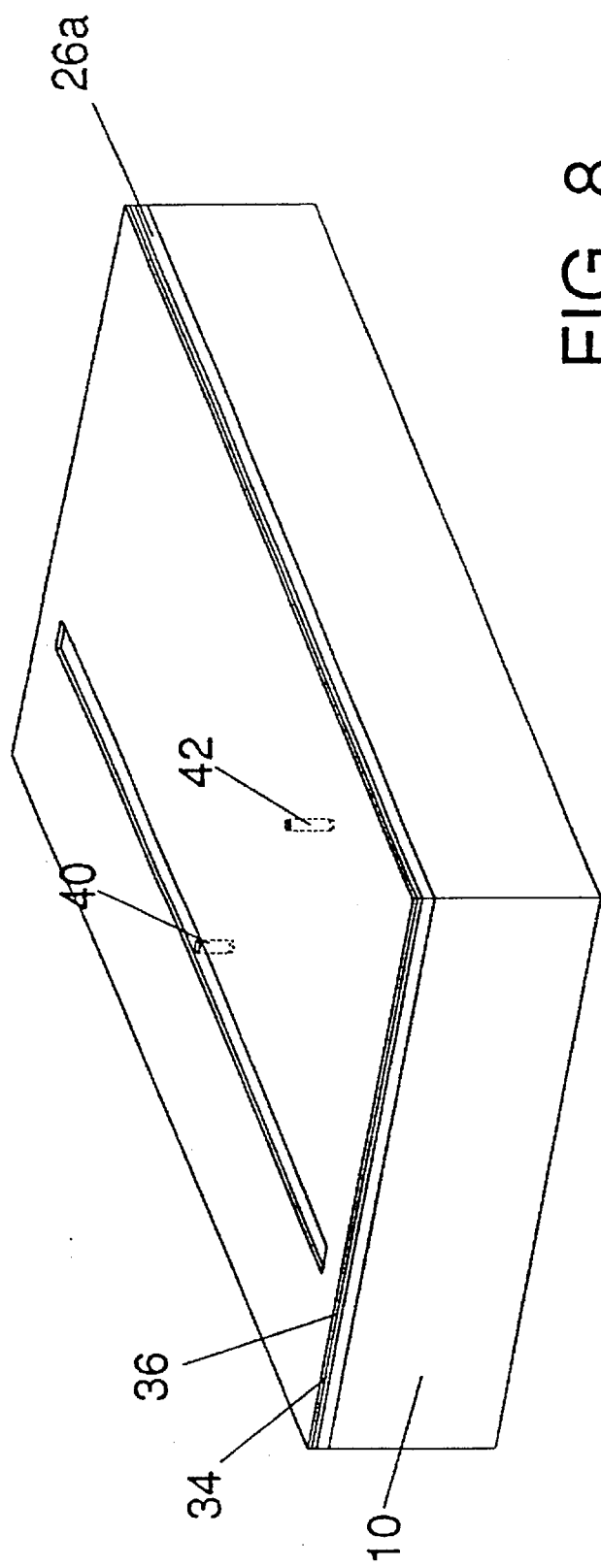
FIG. 8 is a perspective view of the structure after a rapid thermal annealing.

In the cross-section of FIG. 6, a PECVD $Si_3N_4$ layer 36 is in contact with the GaAs cap layer 24. However, in the cross-section of FIG. 7, a PECVD $SiO_2$ layer 34 is in contact with the GaAs cap layer 24. FIG. 8 shows a perspective view of the structure after Rapid Thermal Annealing (RTA), performed at a predetermined temperature in the range of 700° C. to 900° C. for a period of time ranging from 15 seconds to 10 minutes. The specific temperature and time are dependent on several parameters, including the layer thickness of the PECVD $SiO_2$ 34 and the level of intermixing that is desired in order to change the bandgap of the structure. The RTA step causes diffusion of Ga from the GaAs cap 24 into the $SiO_2$ 34 layer. However, the diffusion of Ga from regions of the GaAs cap 24 layer in immediate contact with the $Si_3N_4$ 36 is negligible during this step. The rapid diffusion of Ga into the $SiO_2$ layer 34 results in the formation of site III vacancies in regions covered by $SiO_2$ 34. This, in turn, causes the intermixing of site III elements, namely Al and Ga. The intermixing will slightly penetrate and diffuse inwardly toward the location of opening 31, wherein the $Si_3N_4$ layer 36 is in immediate contact with the GaAs cap 24. This penetration is slight and diminishes with distance away from the perimeter of opening 31. This provides a highly desirably gradual change in the level of intermixing in the laser structure from outside the opening to inside the opening.

Since the lower laser structure 26 is modified by the impurity-free diffusion process, it will henceforth be referred to as 26a.

Figure 9:
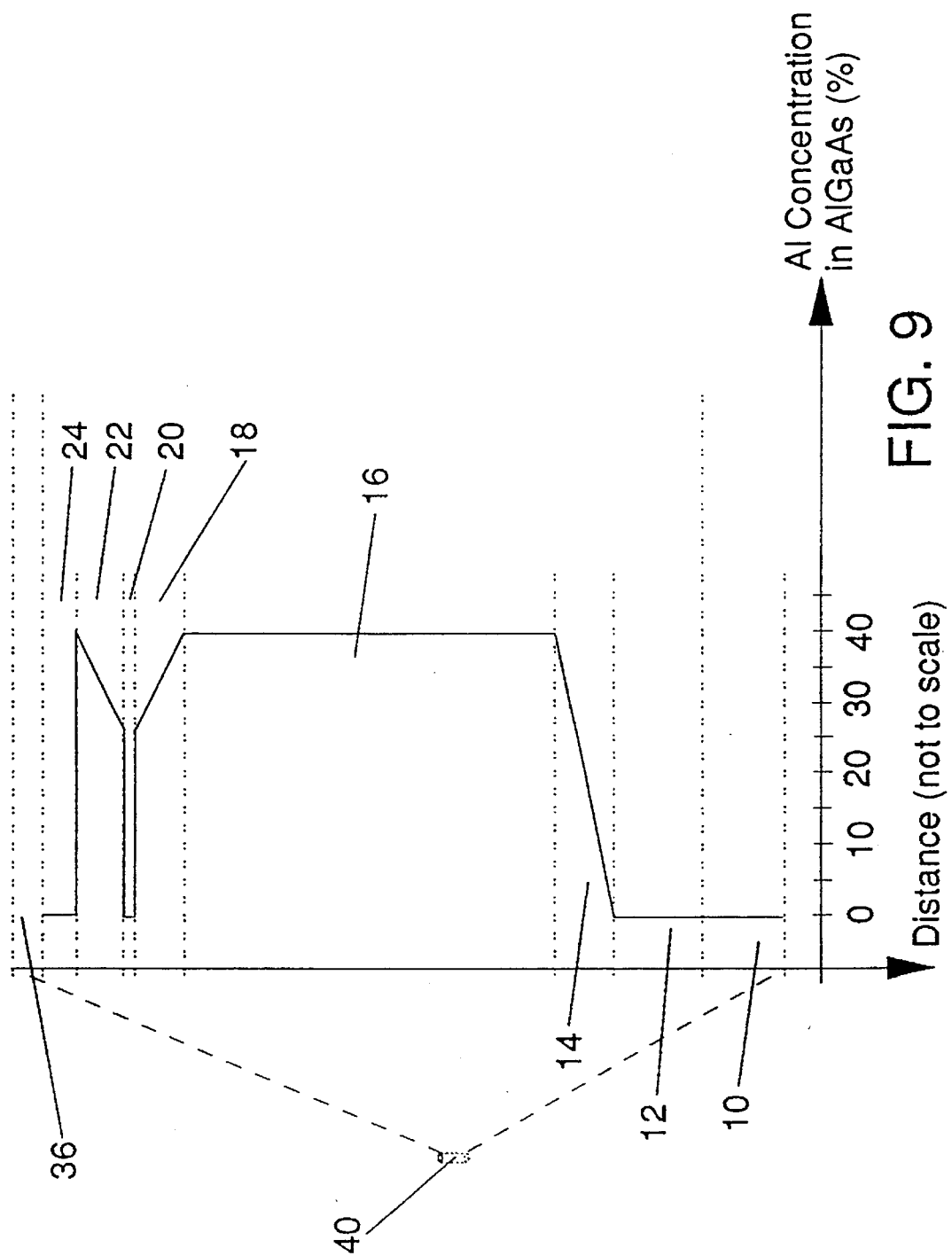
FIGS. 9 and 10 show cross-sections at two different points in the structure of FIG. 8.
Figure 10:
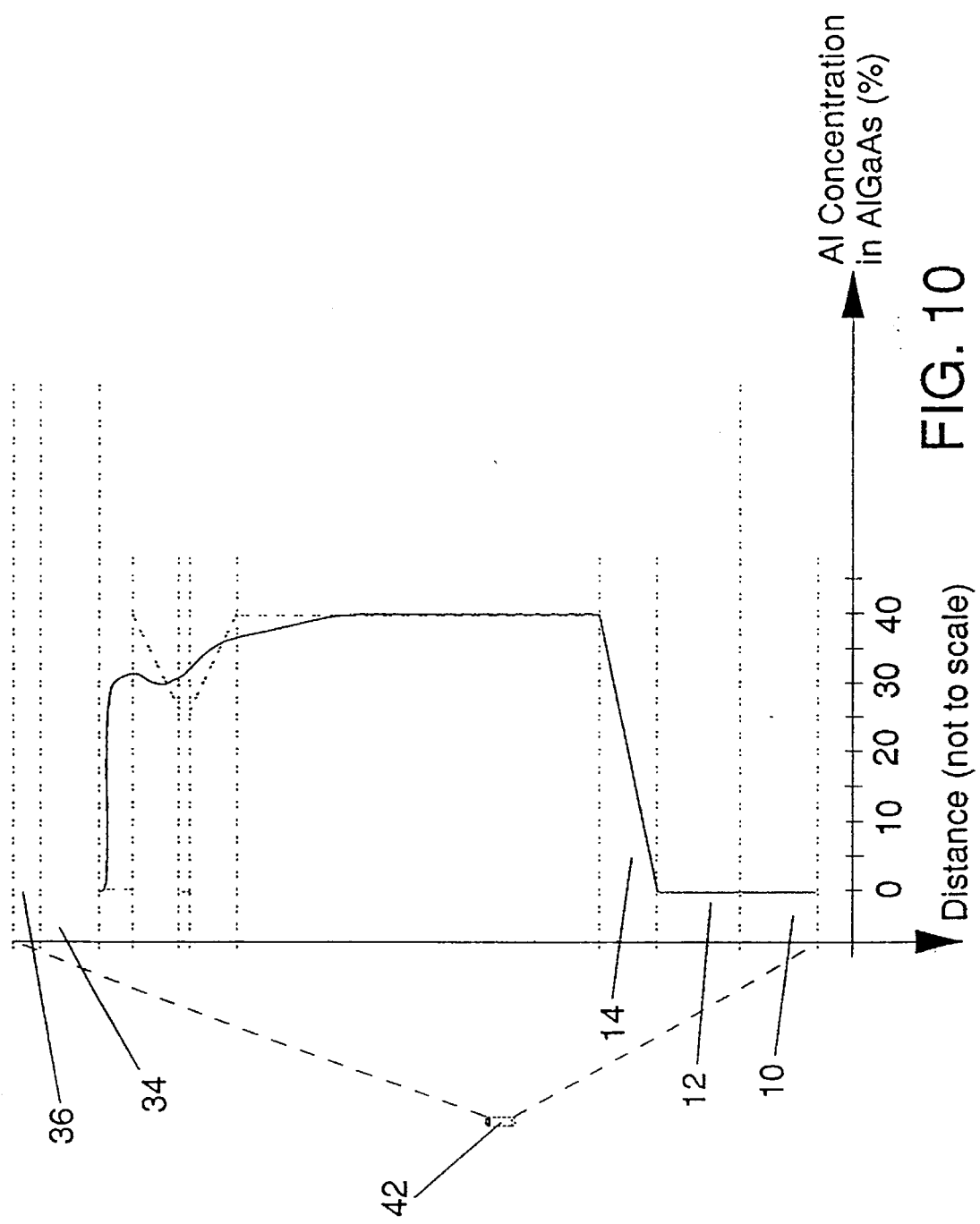

Cross-sections at locations 40 and 42 in FIG. 8 are shown in FIGS. 9 and 10, respectively. They illustrate the drastic difference that is experienced through the impurity-free diffusion process so that the quantum well remains intact only in the area beneath the opening 31 (excluding a thin perimeter ring around and within the opening 31), thereby forming an active area. The effect of the diffusion is that the bandgap is raised outside the active area, thereby lowering the index of refraction. The raising of the bandgap allows current to be funneled to the active area. The lowering of the refractive index allows the beam to be optically confined.

Figure 11:
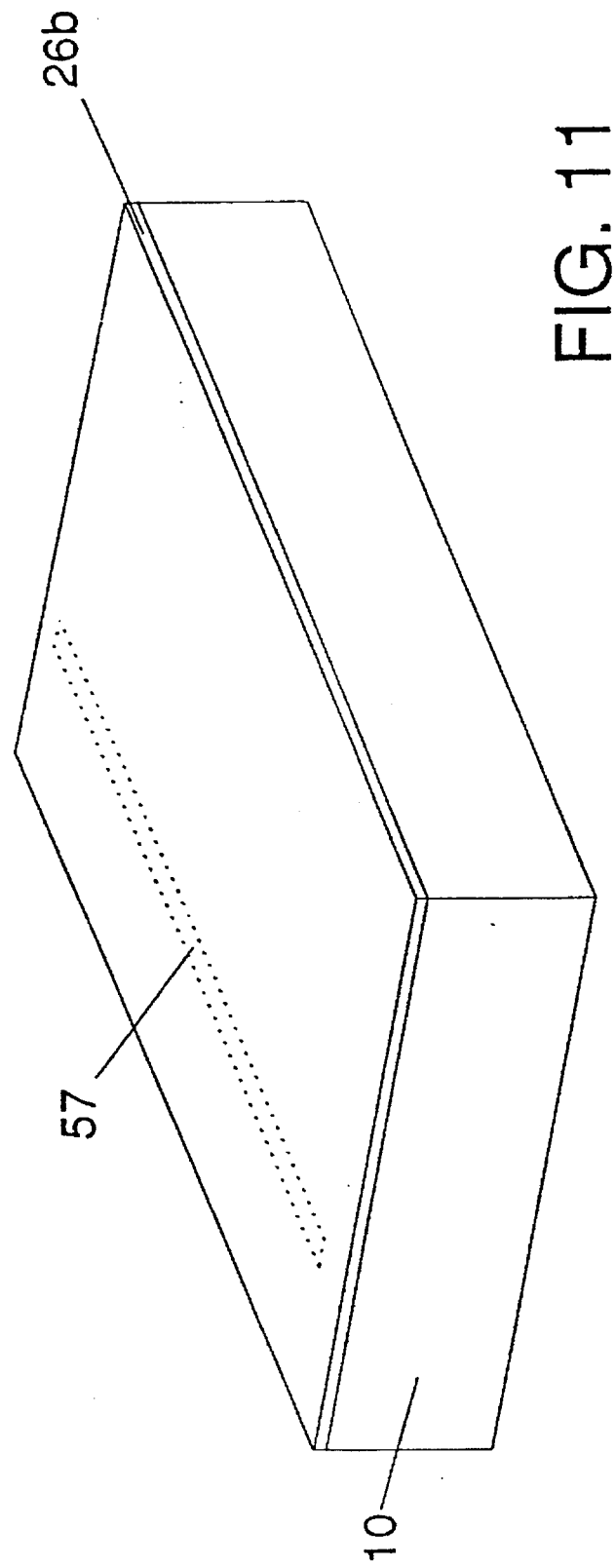
FIG. 11 is a perspective view of the structure after removal of the $Si_3N_4$ and $SiO_2$ layers.
Figure 12:
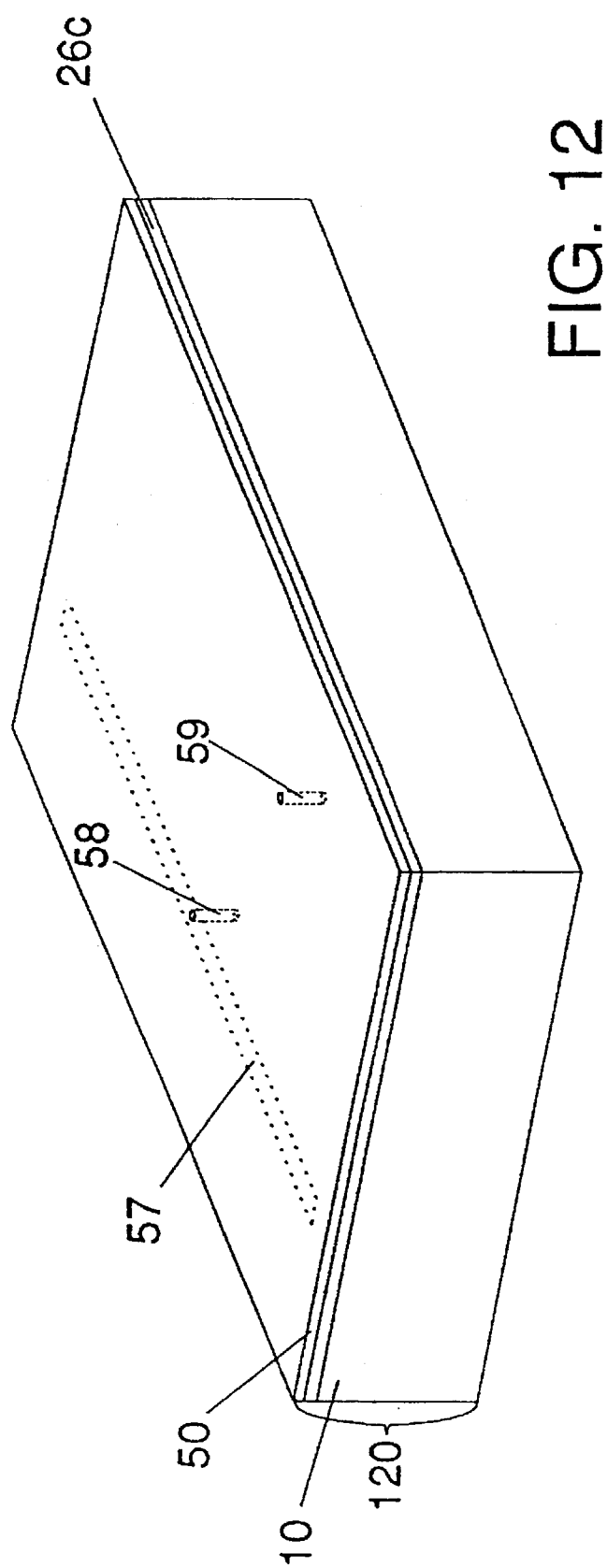
FIG. 12 is a perspective view of the structure after a slight etch and a second MBE deposition to form the upper section of the laser structure.

Next, the $Si_3N_4$ layer 36 is removed using $CF_4$ Reactive Ion Etching (RIE). Subsequently, HF is used to etch off the patterned $SiO_2$ layer 34. Due to the incorporation of Ga into the $SiO_2$, the etching of the $SiO_2$ behaves somewhat differently than that of regular $SiO_2$. Alternatively, both the $Si_3N_4$ layer 36 and the patterned $SiO_2$ layer 34 can be removed in a single low bias voltage $CF_4$ RIE. The surface of the substrate is then etched using $200H_2O:16H_2SO_4:H_2O_2$ to remove 150 nm of GaAs in the region unaffected by the impurity-free diffusion below the position of the opening 31. This etch will generally remove $Al_xGa_{1-x}As$ somewhat more rapidly than GaAs so that the area below opening 31 is slightly higher than the remainder. A perspective view of the structure at this point in the process is shown in FIG. 11. The region above the active area is referred to by numeral 57. Since the modified lower laser structure 26a has been further modified due to the $200H_2O:16H_2SO_4:H_2O_2$ etch, it will henceforth be referred to as 26b. The slight difference in height is almost negligible in comparison to the size of the structure and is not shown in FIG. 11 to enhance clarity. The structure is loaded into the MBE system, and desorption is performed under a flux of As on the remaining 50 nm of GaAs on top of the region unaffected by the impurity-free diffusion. This step removes GaAs, but stops at the AlGaAs layer. When this step is completed, the layers forming the upper region of the semiconductor laser structure 50 are deposited in the MBE system, as shown in FIG. 12. The upper region of the laser structure 50 preferably consists of:

Layer 52, a cladding layer of $Al_{0.4}Ga_{0.6}As$ doped p-type with Be and 1.85 μm;

Layer 54, a linearly graded layer starting at $Al_{0.4}Ga_{0.6}As$ and ending at GaAs, having a thickness of 100 nm. It is p-doped with Be, and Layer 56, a highly p-doped (with Be) GaAs contact layer, having a thickness of 50 nm.

Since the modified lower laser structure 26b has been further modified, due to the removal of GaAs under a flux of As in the MBE system, it will henceforth be referred to as 26c. Although linear grading has been described as the preferred method of grading, it will be understood by those skilled in the art that other types of gradings can advantageously be utilized to form these graded layers.

Figure 13:
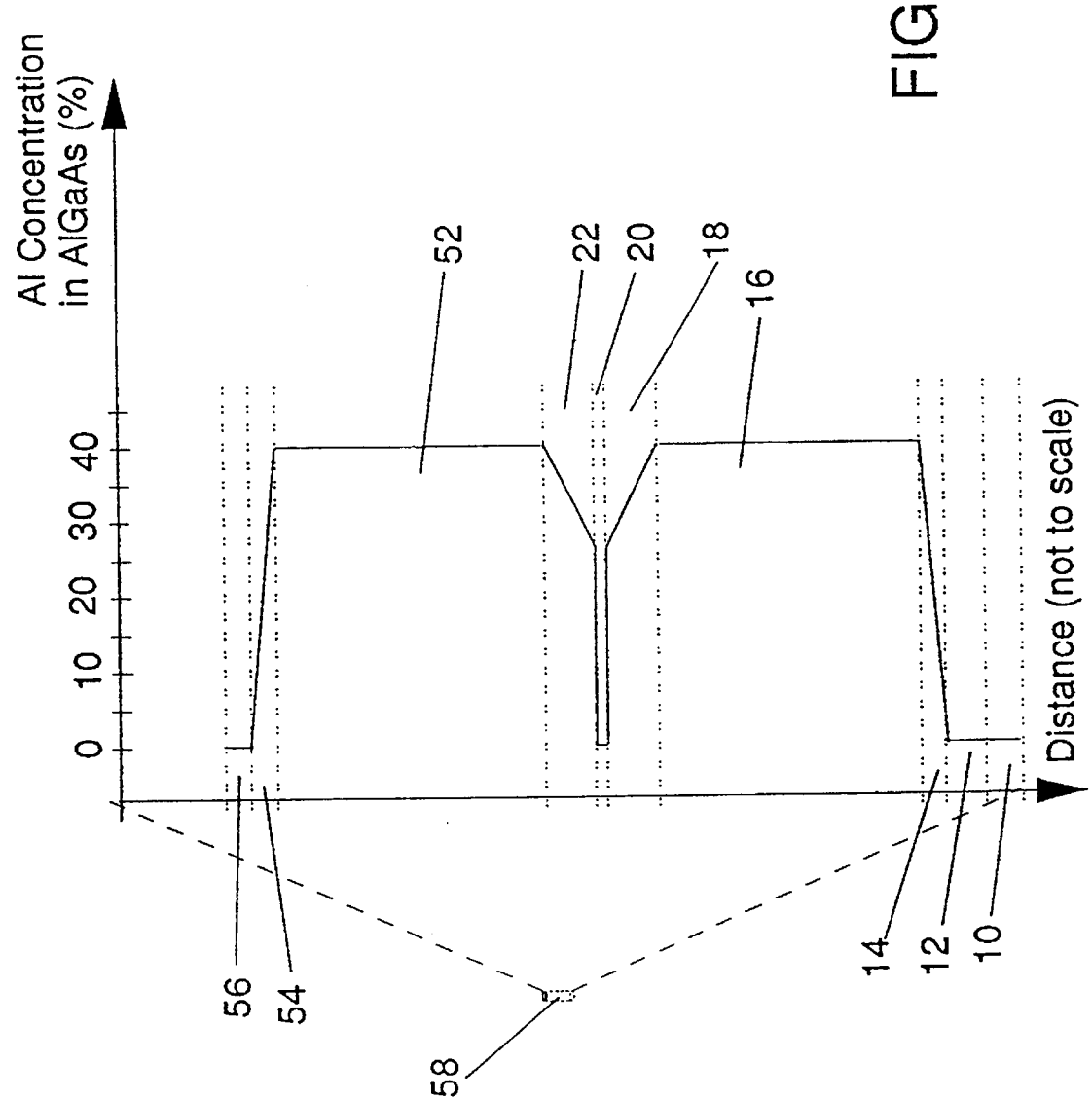
FIGS. 13 and 14 show cross-sections at two different points in the structure of FIG. 12.
Figure 14:
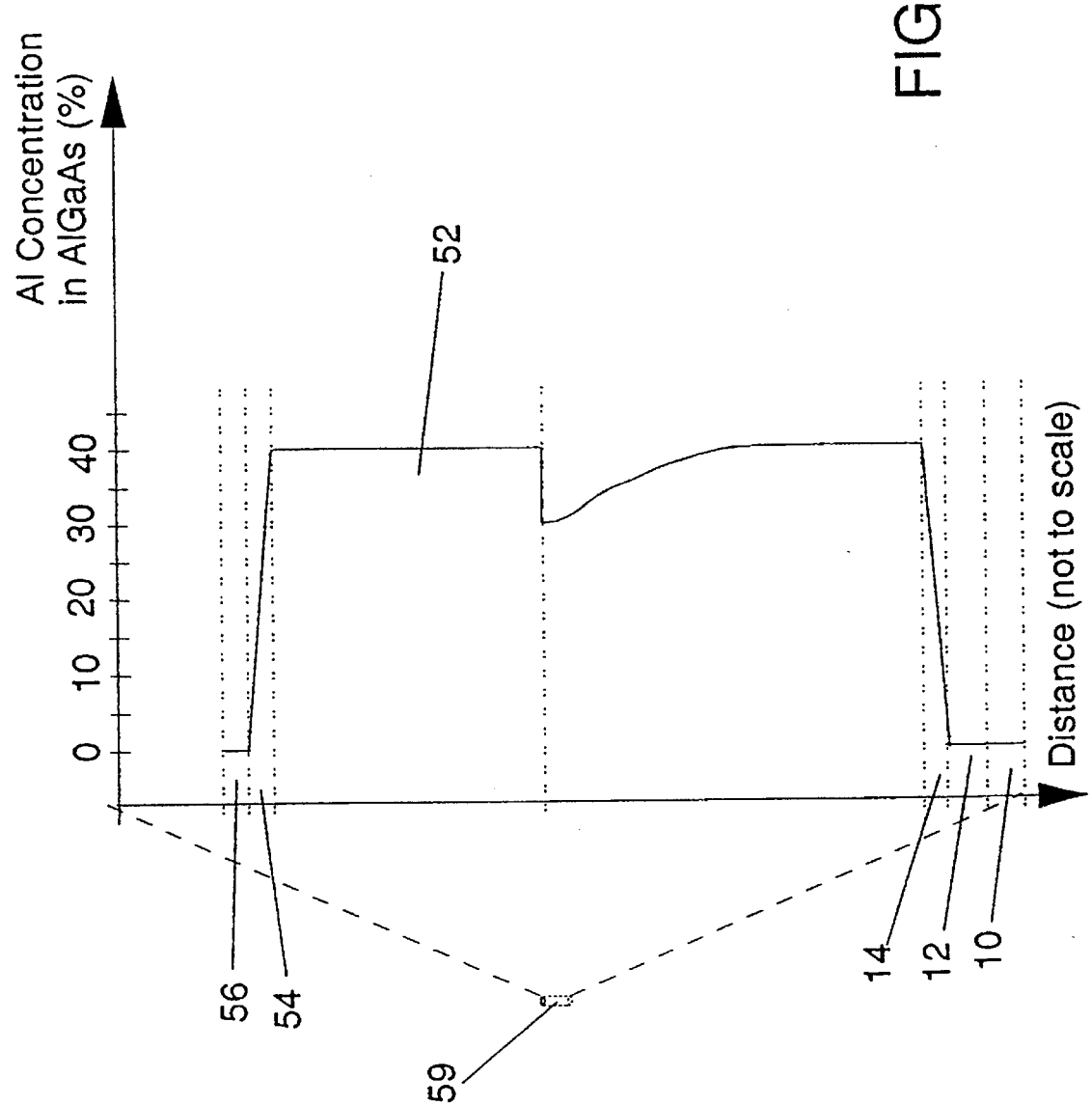

Cross-sections in FIG. 12 at two locations 58 and 59 are shown in FIGS. 13 and 14, respectively, Shown are the structural differences between the region unaffected by the impurity-free diffusion 57 and the region affected by this diffusion.

N-contact 126 is deposited on the back side of the substrate. A layer of 100 nm of PECVD $Si_3N_4$ 108 is deposited on the surface of the laser structure, and the n-contact is preferably annealed in an RTA system. The purpose of coating the front side of the substrate with silicon nitride is to prevent As from escaping from the GaAs contact layer 56 during annealing.

Figure 15:
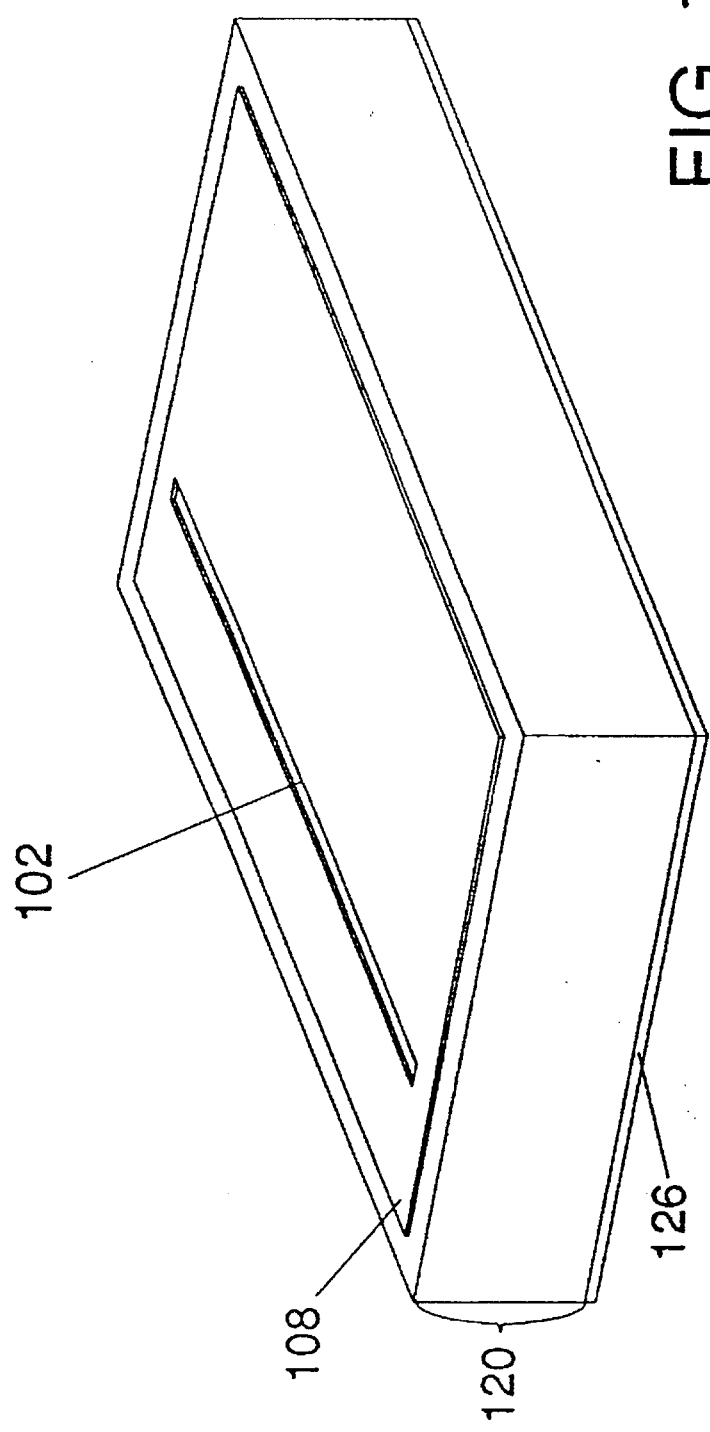
FIG. 15 is a perspective view of the structure after PECVD deposition of $Si_3N_4$ and patterning the $Si_3N_4$ to allow openings for the metal contacts.

Using alignment and photolithographic definition, the $Si_3N_4$ 108 is patterned, as shown in FIG. 15. $CF_4$ RIE performs the patterning of the $Si_3N_4$ 108 with photoresist acting as the mask. The photoresist is then removed. The opening is thus formed for the p-metal contact. Using a metallization lift-off process well-known to those skilled in the art, the p-metal contact 110 is deposited and, thereafter annealed preferably using RTA.

Figure 16:
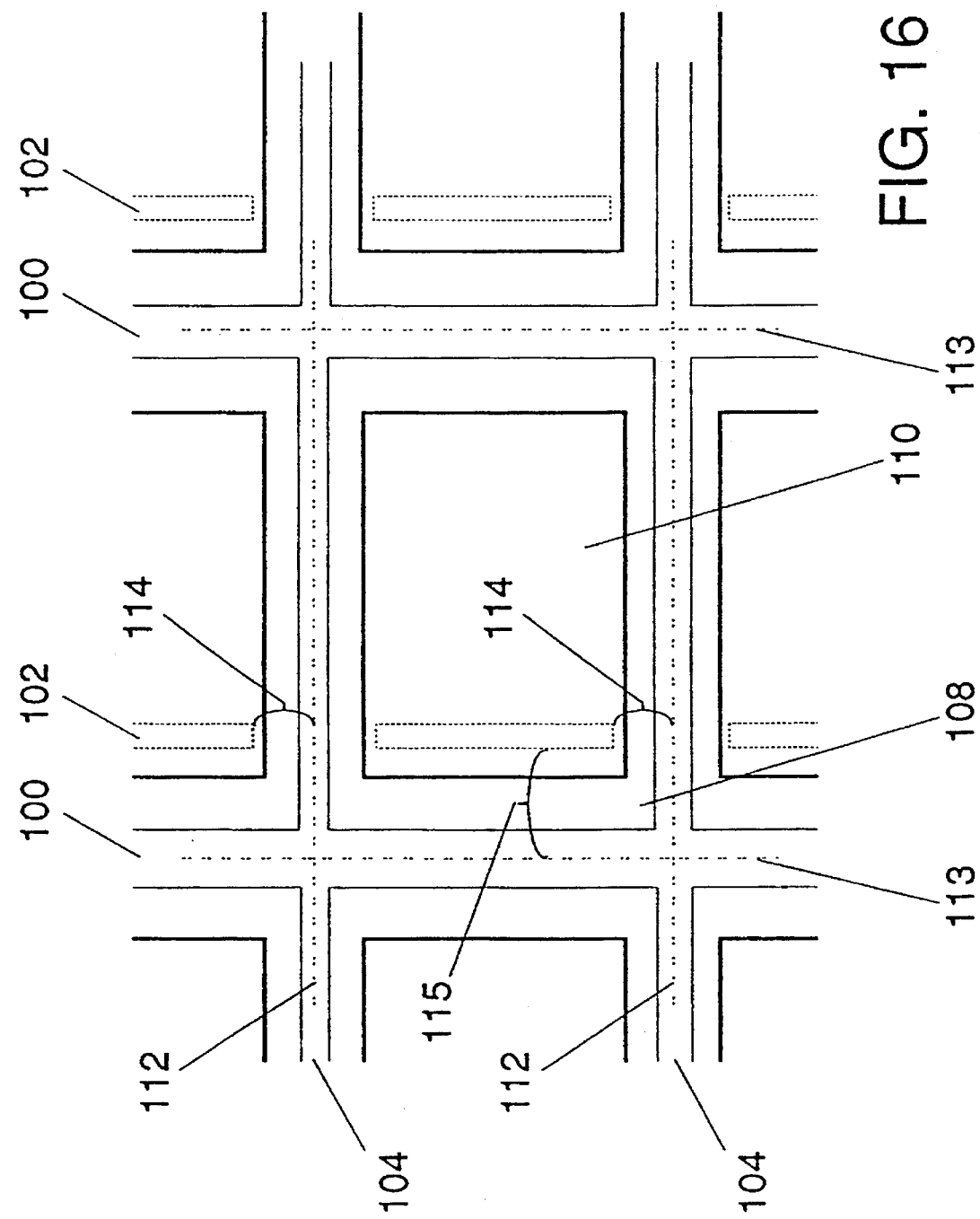
FIG. 16 is a top view of the structure after deposition of the top metallization.
Figure 17:
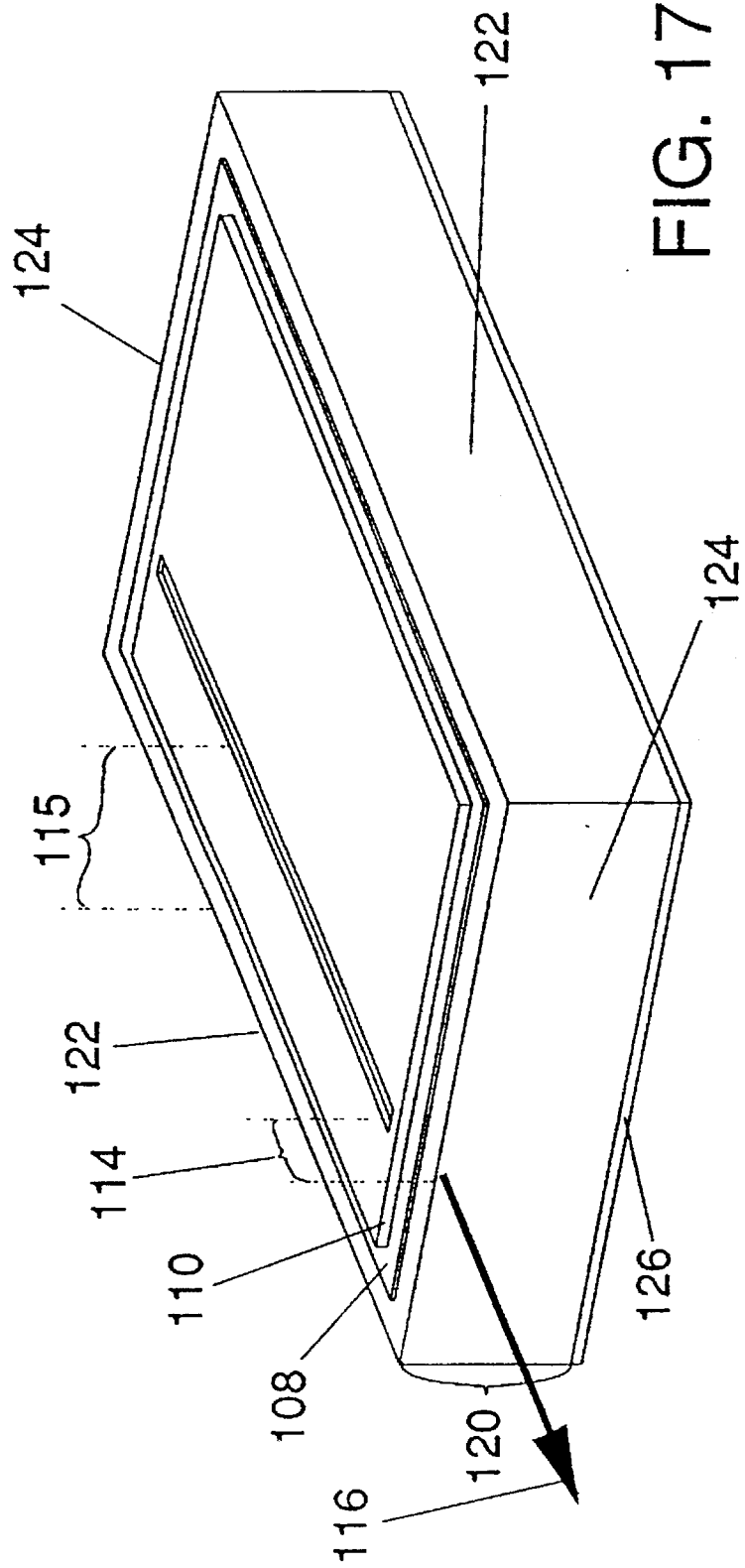
FIG. 17 shows a perspective view of the structure in its final form.

The patterning of $Si_3N_4$ 108 is done in such a way as to form facet cleave channels 104 and dicing channels 100. Lines 112 show the locations where the cleaved facets are formed, whereas lines 113 show where cutting or cleaving actually takes place to allow individual dies to be formed. The active laser area runs parallel to the channels 100 under openings 102 for the p-contact. This is shown in FIG. 16 using a top view. Note that the dashed lines 112, which define the nominal position of cleavage of the laser facets are offset from the edge of the active area by a distance indicated by brackets 114 in FIGS. 16 and 17. This separation allows the contact to be formed through the aforementioned metallization lift-off technique. Dashed lines 113, which define the nominal positions for cutting or cleaving to form the sides 122, are offset from the active region by a distance indicated by brackets 115. This distance has been deliberately set to be different from one side of 122 to the active region than the distance from the opposite side to the active region, as is shown in FIGS. 16 and 17. Finally, after cleaving the facets 124 in channel 104 along 112 and forming the die through cutting or cleaving the sides 122 in channel 100, the device takes its final form, shown in FIG. 17. As can be seen, the resulting physical structure of the laser is highly planar, so that the variation in stress that afflicts ridge lasers is negligible in the active area.

Alternatively, the facets could also have been formed through etching, using the technique outlined by A. Behfar-Rad, et al. in Appl. Phys. Lett. 54 (6), Feb. 6, 1989. The structure lends itself well to this etching technique since the substrate is virtually topology-free. The step of depositing, patterning and removing the $SiO_2$ and $Si_3N_4$ are carried out with conventional integrated circuit techniques well known to those skilled in the art. The process of forming etched facets departs from that of the above process from the point at which layer 108 is deposited. The subsequent steps follow those outlined in U.S. Pat. No. 4,851,368 to A. Behfar-Rad, et al., "Method of making travelling wave semiconductor laser."

The laser structure, shown schematically in FIG. 17, is able to generate an output laser beam 116 from its facets 124.

Although the horizontal far-field has been successfully manipulated in ridge semiconductor lasers through the variation of ridge width and residual etch depth, the achievement of low vertical far-field (VFF) (or beam divergence in the direction perpendicular to the semiconductor laser junction) has been more challenging. The VFF is predominately controlled by the semiconductor layers grown in the epitaxial deposition system. Researchers have gone to highly complex structures (see the article by M. C. Wu previously referred to) to obtain low VFF. Here, the compositions and thicknesses of the various layers that form the laser structure have been carefully designed to minimize internal absorption and achieve low VFF.

If a low VFF is desired, such as in a ridge structure as shown in FIG. 1, then only one sequential epitaxial growth would be needed to form a structure equivalent to that of FIG. 13, as opposed to the two step deposition process discussed above with the impurity free diffusion step in between. In this structure, the Al concentration in $Al_xGa_{1-x}As$, the thicknesses and the dopings will be the same as those previously specified.

Figure 18:
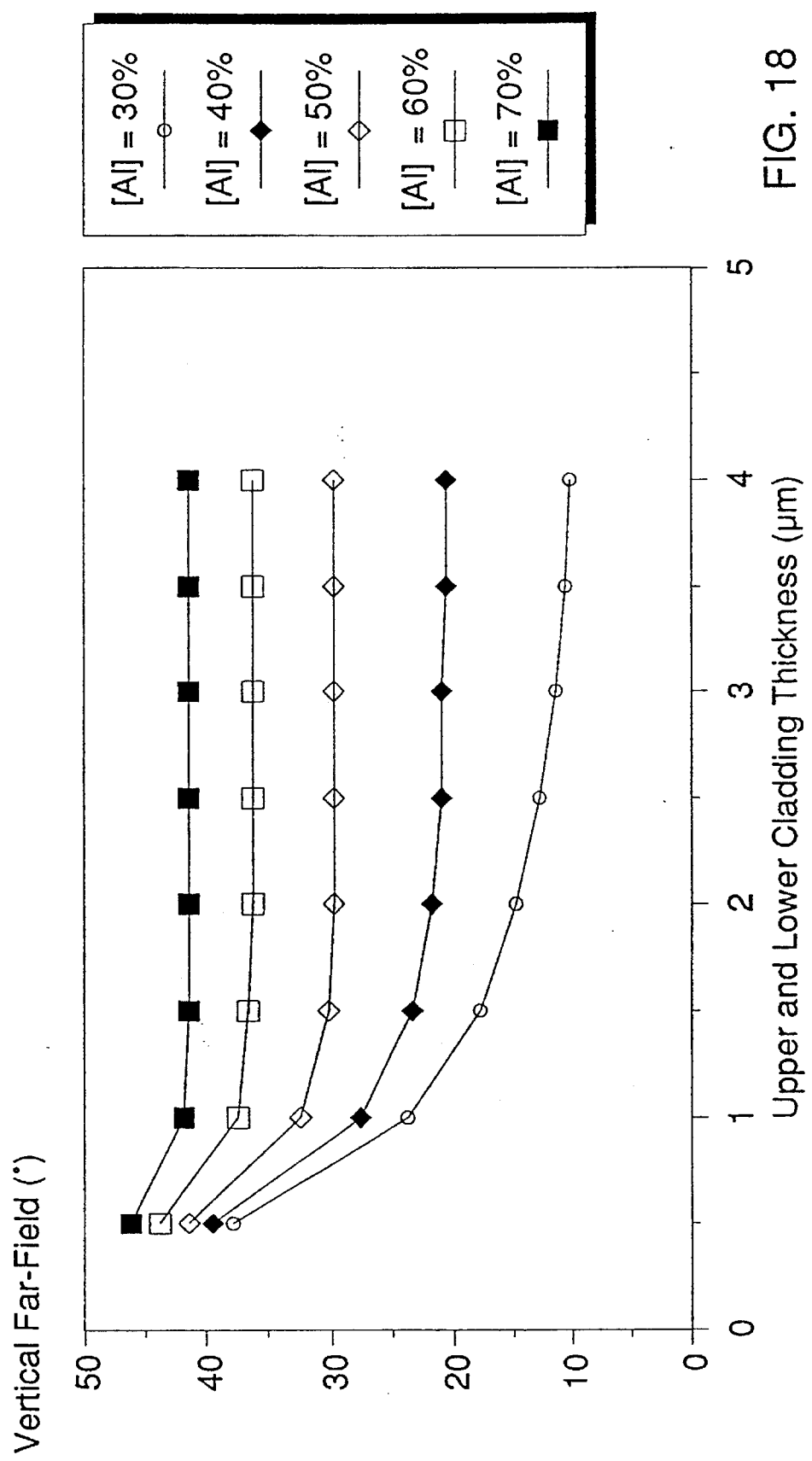
FIG. 18 shows the vertical far-field for the laser structure as a function of upper and lower cladding layer thickness for various Al concentrations [Al] in the AlGaAs claddings.

Referring now to FIG. 18, there is shown a graph illustrating the dependence of VFF on the upper and lower cladding layer thickness for various Al concentrations x. All non-cladding layer thicknesses and Al concentration levels are as shown in FIG. 13, but, for simplicity, the upper and lower cladding layers are set to equal thicknesses. It is readily apparent that at x=0.7 VFF is too high for certain applications such as optical storage. For this case, the variation of VFF is essentially independent of cladding layer thickness above 1 µm. In comparison, at x=0.3, VFF is low, but the curve flattens out only for a thickness greater than 3.5 µm.

Figure 19:
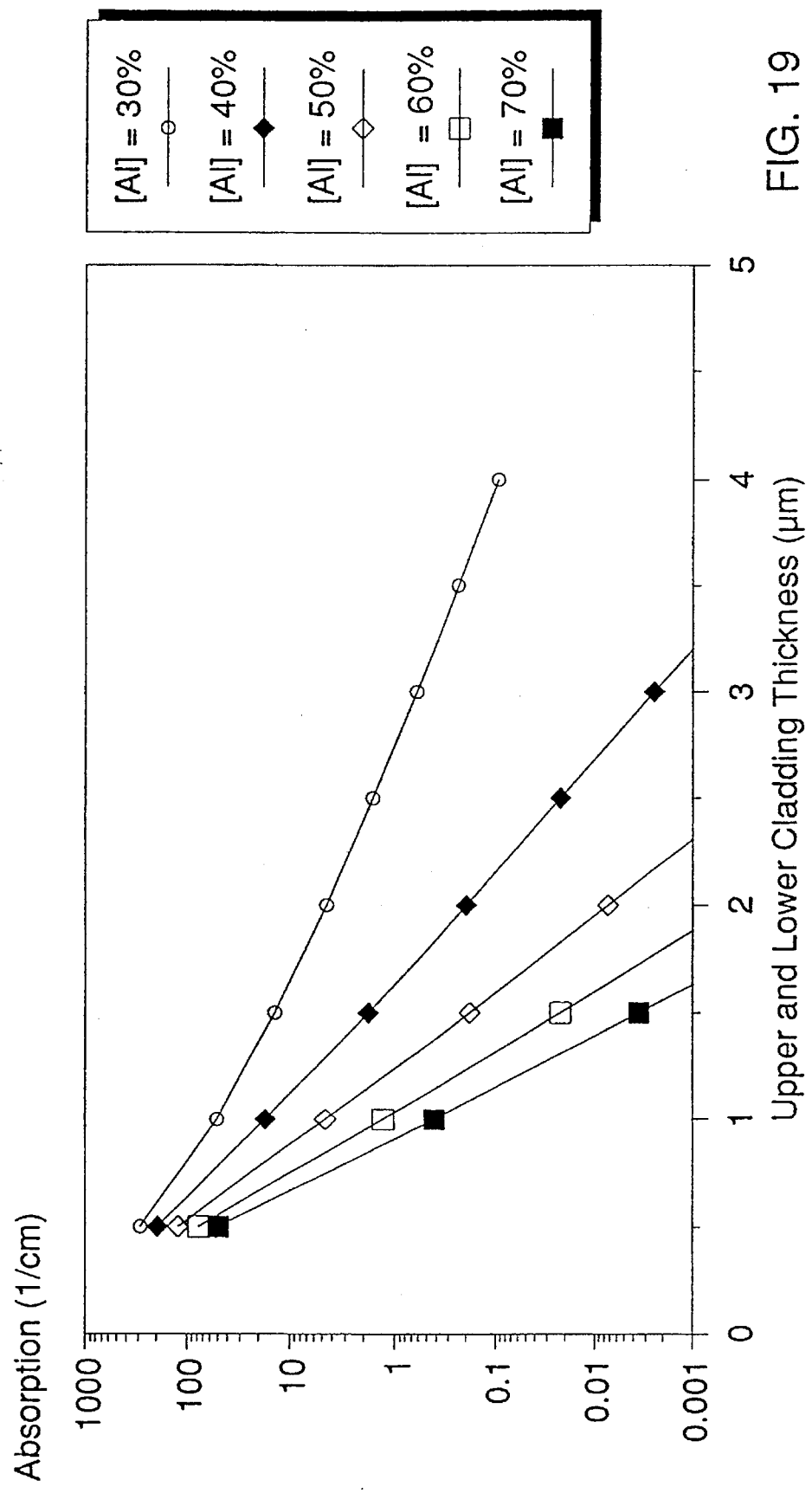
FIG. 19 shows the absorption for the laser structure as a function of upper and lower cladding layer thickness for various Al concentrations in the AlGaAs claddings.

Referring now to FIG. 19, there is shown a plot of absorption versus upper and lower cladding thickness for the same range of x values as in FIG. 18, wherein absorption takes place in the lossy metal contact layer and in the GaAs contact layer at the upper portion of the structure, and at the lower GaAs substrate. Absorption is a variable, depending primarily on the vertical distribution of mode power in lossy regions.

This data establishes that a highly complex structure such as that taught by Wu's reference cited above is not required to achieve acceptably low VFF. If the correct combination of cladding Al concentration and layer thickness is chosen, a low VFF can readily be achieved with the simple structure of FIG. 13, providing the combination also results in a low absorption. The appropriate thickness for a given x value is equal to or greater than the "transition thickness" for which the curve shown in FIG. 18 levels off. This transition thickness also corresponds to an absorption approximately equal to 0.3/cm (see FIG. 19). For example, the transition thickness is about 1.2 µm at x=0.6; 1.4 µm at x=0.5; 1.9 µm at x=0.4; and 3.3 µm at x=0.3. Thus, it will be appreciated by those skilled in the art that values of x between 0.5 and 0.3 with corresponding cladding thicknesses between 1.4 µm and 2.5 µm are the preferred ranges of this phase space for low VFF applications.

Figure 20:
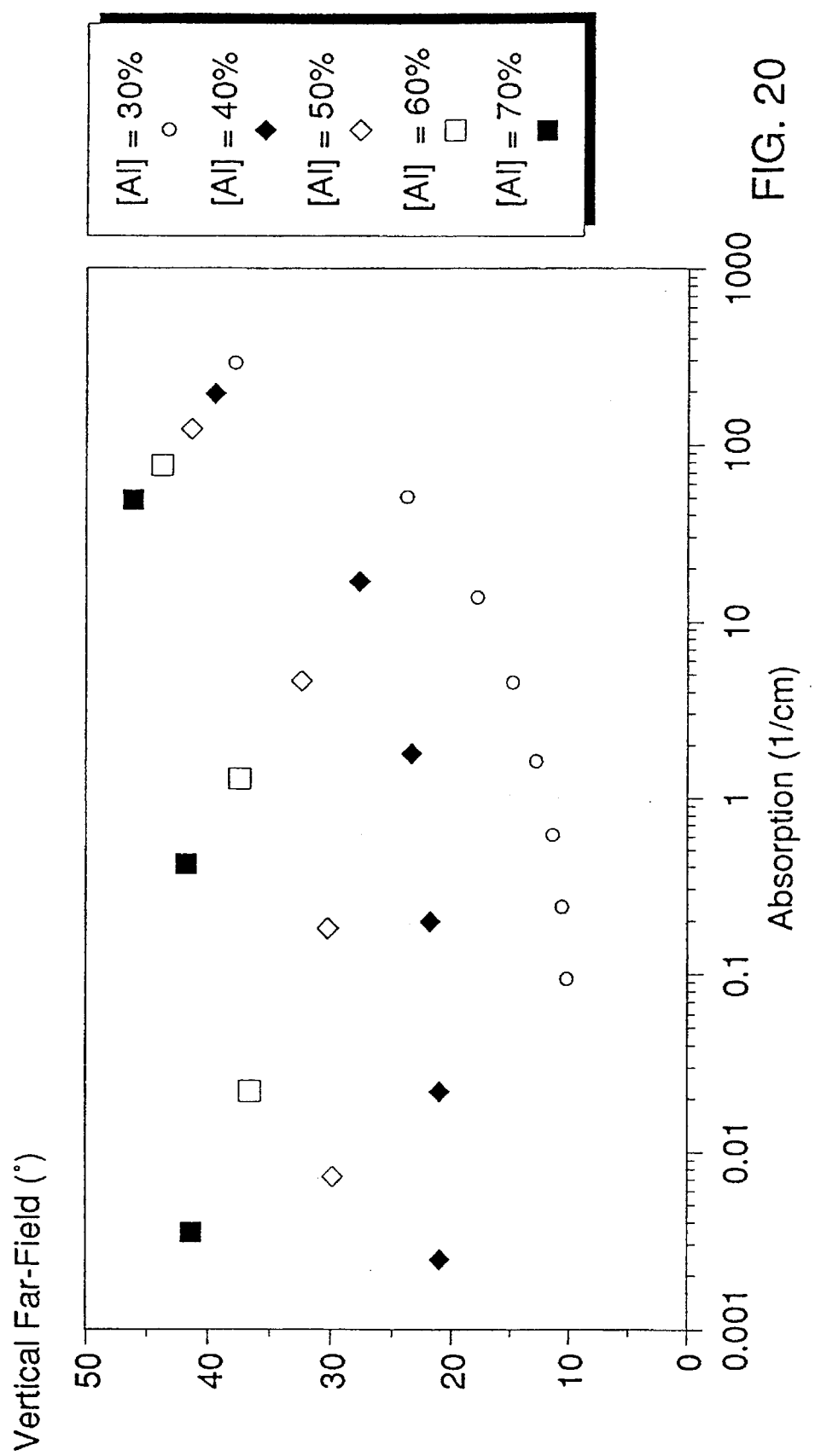
FIG. 20 shows the vertical far-field for the laser structure as a function of the absorption for various Al concentrations in the AlGaAs claddings.

FIG. 20 illustrates the data of FIGS. 18 and 19 for variations of VFF as a function of absorption for the same range of x value for the upper and lower cladding layers used in FIGS. 18 and 19. FIG. 20 also shows that the VFF remains essentially independent of absorption for absorption values less than about 0.3/cm.

While the invention has been particularly shown and described with respect to various preferred embodiments thereof, it will be understood by those skilled in the art that the foregoing and other changes in form and details may be made therein without departing from the spirit and scope of the invention.

What is claimed is:

1. A semiconductor laser having at least a quantum well structure and a plurality of layers of a base chemical composition that includes at least a substitutional element, said at least one quantum well and layers deposited on a substrate, the semiconductor laser comprising:

a lower cladding layer having a first concentration value of the substitutional element;

a lower graded layer on the lower cladding layer having a chemical composition varying from a second concentration value of said substitutional element at a lower interface of the lower graded layer to a third concentration value at an upper interface of the lower graded layer;

the at least one quantum well layer having a fourth concentration value of said substitutional element on the lower graded layer;

an upper graded layer on the quantum well of a chemical composition having a concentration value of said substitutional element varying from a fifth concentration value of said substitutional element at a lower interface of the upper graded layer with the quantum well to a sixth concentration value of said constitutional element at an upper interface of the upper graded layer;

an upper cladding layer of a seventh concentration value of said substitutional element above the upper graded layer; and a contact layer of an eighth concentration value of said substitutional element above the upper cladding layer, wherein each of said layers thickness and its substitutional element concentration are selected to provide the semiconductor laser with an absorptive loss less than 0.3/cm.

2. The semiconductor laser structure as recited in claim 1, wherein the active layer is selected from the group that consists of GaAs, InGaAs and InAlGaAs.

3. The semiconductor laser structure as recited in claim 1, wherein a contact layer of a fourth concentration value of the substitutional element is deposited on said upper cladding layer.

4. The semiconductor laser structure as recited in claim 3, wherein the contact layer is GaAs.

5. The semiconductor laser structure as recited in claim 1, wherein the concentration values of the substitutional element in the laser layers in conjunction with layer thickness provides a vertical far field ranging from 10 to 30 degrees.

6. A semiconductor laser having at least a quantum well structure and a plurality of layers of a base chemical composition that includes at least a substitutional element, said at least one quantum well and layers deposited on a substrate, the semiconductor laser comprising:

a lower cladding layer having a first concentration value of the substitutional element;

a lower graded layer on the lower cladding layer having a chemical composition varying from a second concentration value of said substitutional element at a lower interface of the lower graded layer to a third concentration value at an upper interface of the lower graded layer;

the at least one quantum well having a fourth concentration value of said substitutional element on the lower graded layer;

an upper graded layer on the quantum well of a chemical composition having a concentration value of said substitutional element varying from a fifth concentration value of said substitutional element at a lower interface of the upper graded layer with the quantum well to a sixth concentration value of said substitutional element at an upper interface of the upper graded layer;

an upper cladding layer of a seventh concentration value of said substitutional element above the upper graded layer; and a contact layer of an eighth concentration value of said substitutional element above the upper cladding layer, wherein said concentration values in said lower and upper cladding layers are related to said variations in concentration values in the upper and lower graded layer whereby the index of refraction of the laser structure restricts the vertical far-field of an emitted beam, each of said layers thickness and its substitutional element concentration are selected to provide the semiconductor laser with an absorptive loss less than 0.3/cm and wherein the base chemical composition is GaAs and the substitutional element is Al, and wherein said cladding Al concentration is greater than said third and fifth concentration values for Al and less than 0.6, and said thickness of said upper and lower cladding layers is greater than a transition value characteristic of said cladding Al concentration value.

7. The semiconductor laser as recited in claim 6, wherein said laser is a ridge laser, wherein said quantum well layer exists only in said active area.

8. The semiconductor laser as recited in claim 6, wherein the cladding concentration values of said substitutional element in said upper and lower cladding layers and the thickness of said upper and lower cladding layers are such that the vertical far field of said laser beam is less than a far field divergence amount.

9. The semiconductor laser as recited in claim 6, wherein said cladding concentration value is less than 0.6 and said transition thickness is greater than 1 µm.

10. The semiconductor laser as recited in claim 6, wherein said cladding concentration value is less than 0.5 and said transition thickness is greater than 1.2 µm.

11. The semiconductor laser as recited in claim 6, wherein said cladding concentration value is less than 0.4 and said transition thickness is greater than 1.5 µm.

12. A semiconductor laser structure with low vertical far-field comprising:

a plurality of layers deposited on a substrate, the layers having a base chemical composition and at least one substitutional element, including at least a lower cladding layer having a first concentration value of the substitutional element;

an active layer on said lower cladding layer having a chemical composition of a second concentration value of said substitutional element; and an upper cladding layer on said active layer having a third concentration value of said substitutional element, wherein the laser structure has a vertical far-field ranging from 10° to 30°, and wherein each of said layers thickness and its substitutional element concentration are selected to provide the semiconductor laser structure with an absorptive loss less than 0.3/cm.

13. The semiconductor laser structure recited in claim 12, wherein the said substitutional element is Al and said base chemical composition is GaAs.

14. The semiconductor laser structure as recited in claim 12, wherein the first concentration value of the substitutional element of the lower cladding layer corresponds to $Al_{0.4}Ga_{0.6}As$.

15. The semiconductor laser structure as recited in claim 12, wherein the third concentration value of the substitutional element of the upper cladding layer corresponds to $Al_{0.4}Ga_{0.6}As$.

16. The semiconductor laser structure as recited in claim 12, wherein the lower cladding layer is n-type.

17. The semiconductor laser structure as recited in claim 12, wherein the upper cladding layer is p-type doped.

* * * * *